(12) United States Patent
Nishino et al.

(10) Patent No.: US 7,767,538 B2
(45) Date of Patent: Aug. 3, 2010

(54) METHOD FOR MANUFACTURING SEMICONDUCTOR DEVICE

(75) Inventors: Hirotaka Nishino, Yokohama (JP); Koichi Kato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 623 days.

(21) Appl. No.: 11/507,007

(22) Filed: Aug. 21, 2006

(65) Prior Publication Data

US 2007/0042612 A1 Feb. 22, 2007

(30) Foreign Application Priority Data

Aug. 22, 2005 (JP) ............................. 2005-240192
Jun. 23, 2006 (JP) ............................. 2006-174262

(51) Int. Cl.
*H01L 21/26* (2006.01)
*H01L 27/14* (2006.01)
*H01L 27/30* (2006.01)

(52) U.S. Cl. ...................... 438/407; 438/160; 438/771; 438/776; 438/792

(58) Field of Classification Search ........................ None
See application file for complete search history.

(56) References Cited

U.S. PATENT DOCUMENTS

2007/0030568 A1* 2/2007 Ohmi et al. .................. 359/584

FOREIGN PATENT DOCUMENTS

| JP | 7-99323 | 4/1995 |
| JP | 2001-44419 | 2/2001 |
| JP | 2004-336057 | 11/2004 |
| JP | 2005-005461 | 1/2005 |
| JP | 2005-101412 | 4/2005 |

OTHER PUBLICATIONS

M.A. Quevedo-Lopez et al., "Thermal stability of hafnium-silicate and plasma-nitrided hafnium silicate films studied by Fourier transform infrared spectroscopy", Applied Physics Letters, vol. 87, p. 012902-1-3, (2005).
Notification of Reasons for Rejection issued by the Japanese Patent Office on Dec. 8, 2009, for Japanese Patent Application No. 2006-174262, and English-language translation thereof.

* cited by examiner

*Primary Examiner*—Kiesha R Bryant
*Assistant Examiner*—Pamela E Perkins
(74) *Attorney, Agent, or Firm*—Finnegan, Henderson, Farabow, Garrett & Dunner, L.L.P.

(57) ABSTRACT

It is made possible to form a silicon nitride film, an aluminum oxide film and a transition metal high-k insulation film of high quality. A manufacturing method includes: forming an insulation film having at least one kind of bonds selected out of silicon-nitrogen bonds, aluminum-oxygen bonds, transition metal-oxygen-silicon bonds, transition metal-oxygen-aluminum bonds, and transition metal-oxygen bonds on either a film having a semiconductor as a main component or a semiconductor substrate, and irradiating the insulation film with pulse infrared light having a wavelength corresponding to a maximum intensity in a wavelength region depending upon the insulation film and having a wavelength absorbed by the insulation film.

20 Claims, 9 Drawing Sheets

METHOD FOR MANUFACTURING SEMICONDUCTOR DEVICE

CROSS-REFERENCE TO RELATED APPLICATION

This application is based upon and claims the benefit of priority from prior Japanese Patent Application Nos. 2005-240192 and 2006-174262, filed on Aug. 22, 2005 and Jun. 23, 2006 in Japan, the entire contents of which are incorporated herein by reference.

BACKGROUND OF THE INVENTION

1. Field of the Invention

The present invention relates to a method for manufacturing a semiconductor device having a silicon nitride film or an aluminum oxide film having a dielectric constant greater than that of a silicon oxide, or a high-k insulation film.

2. Related Art

Until now, a silicon oxide film having high insulating property generated by thermal oxidation has been used as the gate insulation film of MOS transistors and the tunnel insulation film and the inter-electrode insulation film of flash memories and the like. On the other hand, it is necessary to make elements finer in order to improve the performance and the cost performance, and it is also necessary to decrease the film thickness of the gate insulation film, tunnel insulation film and inter-electrode insulation film accordingly. If the film thickness of the insulation film becomes approximately 10 nm or less, however, the probability that electrons and holes pass through the film is increased by the tunnel effect, resulting in a lowered insulating property of the film.

For making MOS transistors and flash memories finer, therefore, it is indispensable to use a high-k insulation film having a dielectric constant greater than that of the silicon oxide film.

On the other hand, the silicon nitride film has a relative permittivity (approximately 7) higher than that (relative permittivity of 3.9) of the silicon oxide. The silicon nitride film has been actually used in LSIs as the passivation film and the barrier film. The silicon nitride film was first put to practical use as a gate insulation film replacing the silicon oxide film.

However, the silicon nitride film formed directly on a substrate typically exhibits a higher interface state as compared with the silicon oxide film. At the present time, therefore, a film having a stacked structure and including a silicon nitride film on the surface side and a silicon oxide film on the side of an interface to a substrate is used as the gate insulation film.

The stacked structure film having the silicon nitride film/silicon oxide film can be formed by, for example, conducting exposure of a silicon oxide film generated by thermal oxidation of the substrate to a nitrogen plasma atmosphere and nitriding the surface of the silicon oxide film.

If the silicon oxide film is made too thin according to device shrinkage, however, it is more likely that nitrogen diffuses to the interface between the silicon oxide film and the substrate at the time of plasma nitridation, resulting in higher interface state. Therefore, a method of first forming a thin silicon nitride film by nitriding a silicon substrate with ammonia gas, nitrogen plasma or the like, and further forming a silicon oxide film between the silicon nitride film and the silicon substrate by conducting thermal oxidation is proposed.

In the process in which the silicon nitride film is formed by nitriding the substrate and then the silicon oxide film is formed at the interface between the silicon nitride film and the silicon substrate, the temperature during silicon nitridation is one important factor. In other words, if the nitridation temperature is too low, then a nitride film having low oxidation resistance is formed. This is because if silicon surface is nitrided by ammonia gas at a too low temperature, ammonia does not decompose perfectly and a nitride film containing impurities such as $NH_x$ (x=1, 2) is apt to be formed. As bond strength of N—H is smaller than that of Si—N, a nitride film with $NH_x$ is easily oxidized. Furthermore, probability of oxygen diffusion in the film is high at places where impurities exist. Therefore, at the time of substrate oxidation, the nitride film is apt to be oxidized and locally thick silicon oxide film is formed at the interface between the silicon nitride film and the silicon substrate, producing a stacked dielectric film with low dielectric constant. Even when plasma nitridation is performed using gas that does not contain hydrogen, such as pure nitrogen, too much decreasing of nitridation temperature reduces resistance of a silicon nitride film against oxidation. This is because reaction of silicon nitridation proceeds only halfway and a silicon nitride film containing a large quantity of dangling bonds is formed. If such nitride film is exposed to oxygen, dangling bond in the film dissociates oxygen, and active oxygen such as oxygen atom is generated, inducing exaggerate oxidation of the silicon nitride film and underlying silicon substrate.

The oxidation resistance of the silicon nitride film is improved by raising the nitridation temperature. However, if silicon nitridation is performed at too high temperature in conventional RTA (Rapid Thermal Annealing) equipment, a nitride film in an island form is apt to be produced. The following reason is conjectured. Since typical temperature of silicon nitridation (1000° C. or below) is much less than the melting point of silicon nitride (approximately 1900° C.), surface tension of silicon nitride produced by silicon nitridation is large and energy of silicon nitride film is lowered by cohesion. With increasing silicon nitridation temperature, migration speed of silicon atom in substrate during nitridation increases, producing more silicon nitride in island form. If the island-shaped nitride film is oxidized, however, a thick oxide film is partially generated by oxygen diffused through places where the film is thin, resulting in a problem of lowered electrical characteristics of the whole dielectric film.

On the other hand, since the dielectric constant of the silicon nitride film is not so large, an insulation film having a larger dielectric constant is needed. Therefore, dielectric films of transition metal oxide, oxynitride, silicate, nitrided silicate, aluminate, and nitrided aluminate are under development.

Since such a high-k insulation film includes an element different from that of the underlying layer, it is formed by sputtering or deposition such as CVD (Chemical Vapor Deposition) or ALD (Atomic Layer Deposition). Typically, temperature of high-k film deposition is lower than that of silicon thermal oxidation. This is because too much raising the deposition temperature causes phase separation and crystallization of a high-k material, producing a film with uneven composition and thickness. On the other hand, trapping of electrons and holes is apt to occur and the level of the leak current is also high, in the insulation film formed at a too low temperature. Although the cause thereof is not made clear sufficiently, impurity in the film, such as CHx, NHx and OH, is considered to be one cause. Even for a dielectric film containing less impurity, such as the film formed by sputtering or substrate thermal oxidation, however, film quality is lowered with decreasing the formation temperature. This indicates that there are some factors degrading the insulating film quality (such as dangling bond and distorted bond) besides the impurity.

On the other hand, it is reported that the following problems occur when a polycrystalline silicon film is used as an electrode of a high-k insulation film. One is a Fermi level pinning where Fermi level of polycrystalline silicon electrode is fixed near mid gap of silicon band gap. The origin of Fermi level pinning is not clarified. One possibility is that during deposition of polycrystalline silicon on a high-k film or heating it to activate impurities contained in the polycrystalline silicon film, the polycrystalline silicon film reacts with high-k insulation film, producing defect such as oxygen vacancy at the interface between electrode and high-k film. Reaction between polycrystalline silicon and high-k film also induces silicon atom diffusion from electrode into a high-k film, resulting in a lowered film quality of the high-k insulation film. Even in the case where a metal film or a metal compound is used as the electrode, a similar problem could occur depending upon the kind of the metal. To solve these problems, it becomes necessary to insert a thin reaction suppression layer between the high-k insulation film and the electrode.

To prevent lowering the averaged dielectric constant of stacked insulator (reaction suppression layer and high-k film), however, the reaction suppression layer of a high dielectric constant with least thickness must be formed. Therefore, an extremely thin silicon nitride film and an aluminum oxide film are considered to be promising as the reaction suppression layer. Typically, silicon nitride film and aluminum oxide film are formed by CVD, ALD or the like, using gases such as $SiCl_4/NH_3$ and $Al(CH_3)_3/H_2O$. Just as the high-k insulation film, the suppression layers are usually formed at a relatively low temperature. Therefore, these films contain impurity such as NHx, CHx and OH and defect to some degree. The impurity and defect contained in the reaction suppression layer, not only lower electric characteristics but also degrades barrier property of the film. It is difficult to remove impurity and defect completely from the film even if heat treatment at very high temperature is conducted in the conventional RTA equipment. To form a reaction suppression layer having a sufficient barrier property and exhibiting favorable electrical characteristics, therefore, the thickness of the film must be large, and it is hard to make the stacked insulator of reaction suppression layer/high-k with large averaged dielectric constant in the film.

By the way, a technique of changing the film quality by exposure of the low dielectric constant film to $CO_2$ laser light is known (see, for example, JP-A 2005-5461 (KOKAI)). However, it is not disclosed therein to change the film quality of the silicon nitride film, the aluminum oxide film or the high-k insulation film.

In general, the film forming temperature of the silicon nitride film, the aluminum oxide film and the high-k insulation film is lower than the forming temperature of the thermally oxidized silicon film, as described above.

On the other hand, it is known that heating a thermally oxidized silicon film formed at a low temperature up to 900° C. or higher not only decreases the stress of the film but also improves the electrical characteristics of the film. The following reason is considered. The silicon oxide film formed at a low temperature contains distorted bonds. Heating the silicon oxide film at higher than about 950° C., which is the temperature of viscosity increase in silicon oxide, decreases the distorted bond in the film, which results in improving electrical characteristics of silicon oxide film.

When heat treatment is conducted in the RTA equipment after the film formation, the electrical characteristics of the silicon nitride film, the aluminum oxide film and the high-k insulation film are improved. The decrease in impurity and distorted bond in the film may origin of the improvement in electrical characteristics of the film. Even if RTA processing at approximately 1000° C. is conducted on the silicon nitride film, the aluminum oxide film and the high-k insulation film, the electrical qualities of these films are worse than that of the silicon oxide film produced by thermally oxidation of silicon at 1000° C. The cause thereof is not clear. Residual impurity in the film formed by CVD and ALD could be origin of low electrical characteristics. As explained below, concentration of distorted bond in the film of silicon nitride, aluminum oxide, and high-k material may be high compared to that in the silicon oxide film, which could degrade electrical quality of the former film.

Although the viscosity increase temperature depends on the material, empirically it is said to be approximately two thirds of the melting point. The melting point of the silicon oxide film is approximately 1700° C. (1930K). Therefore, two thirds of the melting point is approximately 1040° C. (1315K), and it is close to the above-described viscosity increase temperature 950° C. Melting points of the silicon nitride film and the aluminum oxide film are approximately 1900° C. and 2050° C., respectively. Melting points of $HfO_2$, $ZrO_2$, $Y_2O_3$ and $La_2O_3$, which are materials of the high-k insulation film currently under study, are approximately 2760° C., 2720° C., 2410° C. and 2310° C., respectively. Therefore, the viscosity increase temperature is presumed to be approximately 1180° C. in the silicon nitride film, approximately 1280° C. in the aluminum oxide film, and approximately 1750° C., 1720° C., 1515° C. and 1450° C. in $HfO_2$, $ZrO_2$, $Y_2O_3$ and $La_2O_3$, respectively. Unless heating to 1200° C. to 1700° C. or more is conducted, therefore, there is a possibility that distortions in the film will not be sufficiently relaxed in these insulation films.

The RTA equipment in current use has been developed with the object of forming a thin silicon oxide/silicon nitride by thermal oxidation/nitridation and forming a shallow junction. Here, it is important to heat silicon substrate efficiently, and exposure of a sample to light to be absorbed by silicon is conducted. Light emission characteristics of a halogen lamp, which is frequently used in the RTA equipment, slightly depend on the temperature of a tungsten filament. Typically, intensity of the light emitted from the lamp has a peak at a wavelength close to 1 µm, and it has distribution in a wide wavelength region ranging from approximately 0.1 µm to 3 µm.

On the other hand, silicon absorbs light having energy of approximately 1.1 eV or higher, which is the band gap of silicon, in other words, light having a wavelength of approximately 1.1 µm or less. Therefore, silicon can be heated efficiently by irradiation of light from the halogen lamp.

On the other hand, the high-k insulation film has a band gap that is far greater than that of silicon. For example, $HfO_2$ has a band gap of approximately 6 eV.

Infrared light absorption of silicon nitride film and aluminum oxide film, transition metal oxide (oxynitride) films having transition metal-oxygen bond, such as the, $HfO_2$ film, $ZrO_2$ film and $Y_2O_3$ film, transition metal (nitrided) silicate films having transition metal-oxygen-silicon bond, such as a HfSiO film and a ZrSiO film, and transition metal (nitrided) aluminate films having transition metal-oxygen-aluminum bond, such as a HfAlO film and a LaAlO film, exists in a region of wavelength larger than approximately 1.1 µm.

It is appreciated from the foregoing description that halogen lamp light is scarcely absorbed by the silicon nitride film, the aluminum oxide film or the high-k insulation film even if exposure of the film to the halogen lamp light is conducted. When a silicon substrate, with an insulation film such as silicon nitride film, aluminum oxide film, and high-k insulation film on its surface, is exposed to halogen lamplight, therefore, heating of the insulation film is caused scarcely by optical absorption.

On the other hand, in the silicon substrate, a part of absorbed light is changed to heat. Therefore, the silicon substrate is heated by exposure to the halogen lamp light. As the temperature of the silicon substrate rises, heat conduction from the silicon substrate to the insulation film occurs and the temperature of the insulation film also rises.

When the processing is thus conducted in the conventional RTA equipment, the insulation film is heated by heat conduction and consequently temperature can be raised only as high as the silicon substrate. On the other hand, it is reported that silicon atoms are diffused from the silicon substrate to the insulation film and electrical characteristics of the insulation film are degraded if a silicon substrate having a silicon nitride film, an aluminum oxide film or a high-k insulation film formed on its surface is heated to approximately 1000° C. or more. It is appreciated from the foregoing description that the silicon nitride film, the aluminum oxide film or the high-k insulation film on the silicon substrate can be heated only to approximately 1000° C. when processing is conducted by using the conventional RTA equipment. This heating temperature is much lower than a temperature (1200° C. to 1700° C. or more) at which it is anticipated that the viscosity of these insulation films increases and concentration of defect in these films decreases.

After formation the aluminum oxide film or the high-k insulation film, heat treatment in an atmosphere of gas (such as $O_2$, $O_3$ or $H_2O$) containing the oxygen element is conducted by using the RTA equipment in order to reduce impurities such as NHx, CHx and OH and defects such as oxygen losses in the film. If the partial pressure of gas containing the oxygen element in the atmosphere is raised too much in order to change the quality of the film sufficiently, however, a thick silicon oxide film becomes apt to be formed between the insulation film and the silicon substrate. It is considered that this is caused partially by the fact that heating in the conventional RTA equipment raises the temperature of the silicon substrate and facilitates the progress of the oxidation reaction of silicon. Since the dielectric constant of the silicon oxide film is low, however, the dielectric constant of the whole insulation film falls if a thick interface silicon oxide film is formed.

At the present time, a transistor using germanium, which is larger than silicon in mobility of electrons and holes, for its channel is being developed in order to increase the operation speed. It is being studied to apply a high-k insulation film such as $ZrO_2$ to the gate insulation film of the germanium transistor as well. Germanium has a band gap of approximately 0.66 eV, and absorbs light having a wavelength of approximately 2 µm or less. Therefore, germanium can also be heated in the conventional RTA equipment.

Even if exposure of germanium having a high-k insulation film formed thereon to halogen lamp light is conducted in the same way as the case where an insulation film is formed on silicon, however, the high-k insulation film cannot be heated to a temperature higher than that of germanium. In addition, germanium has a melting point of approximately 945° C., which is lower than that of silicon. For these reasons, the high-k insulation film formed on germanium can be heated only to a low temperature and it is difficult to improve the quality of the film sufficiently, when processing is conducted in the conventional RTA equipment.

Furthermore, if the silicon nitride film is formed directly on the silicon substrate or the germanium substrate by using the conventional method, the silicon nitride film exhibits large interface state characteristics. Therefore, the silicon nitride film cannot be applied with a single layer to a gate insulation film of a transistor or a reaction suppression layer between the substrate and the high-k metal insulation film.

Application of an extremely thin silicon nitride film to a base film of a silicon nitride film/silicon oxide film stacked gate insulation film or to a reaction suppression layer between a high-k metal insulation film and a silicon substrate or a polycrystalline silicon top electrode is being studied. If the extremely thin silicon nitride film is heated to a high temperature, however, local aggregation is apt to occur. Therefore, the processing temperature during the film formation and after the film formation cannot be raised so much. As a result, a silicon nitride film having an even thickness and sufficiently high oxidation resistance cannot be formed.

As described above, it is very hard to remove impurity and defect completely from the aluminum oxide film, the silicon nitride film and the high-k metal insulation film by heating the film using the conventional RTA equipment. For suppressing the reaction between the electrode and the high-k insulation film, therefore, it is necessary to form a comparatively thick reaction suppression layer such as silicon nitride film, resulting in a problem of a lowered dielectric constant of the whole insulation film.

An oxide film, an oxynitride film, a nitrided silicate film, an aluminate film, and a nitrided aluminate film of transition metal are under development with the object of applying them to a gate insulation film of a transistor or an inter-electrode insulation film of a flash memory. If heat treatment is conducted by using the conventional RTA equipment, however, these high-k insulation films cannot be heated to a temperature higher than that of underlying silicon or germanium, and consequently defects in the film cannot be decreased sufficiently.

SUMMARY OF THE INVENTION

A method for manufacturing a semiconductor device according to a first aspect of the present invention includes: forming an insulation film having at least one kind of bonds selected out of silicon-nitrogen bonds and metal-oxygen bonds on either a film having silicon as a main component or a silicon substrate, by using either chemical vapor deposition or atomic layer deposition; and irradiating the insulation film with pulse infrared light having a wavelength of a maximum intensity in a range of 1.1 µm or more to 9 µm or less.

A method for manufacturing a semiconductor device according to a second aspect of the present invention includes: forming an insulation film having at least one kind of bonds selected out of silicon-nitrogen bonds and metal-oxygen bonds on either a film having germanium as a main component or a germanium substrate, by using either chemical vapor deposition or atomic layer deposition; and irradiating the insulation film with pulse infrared light having a wavelength of a maximum intensity in a range of 2 µm or more to 12.5 µm or less.

A method for manufacturing a semiconductor device according to a third aspect of the present invention includes: forming an insulation film having at least one kind of bonds selected out of silicon-nitrogen bonds, aluminum-oxygen bonds, transition metal-oxygen-silicon bonds, transition metal-oxygen-aluminum bonds, and transition metal-oxygen bonds on either a film having a semiconductor as a main component or a semiconductor substrate; and irradiating the insulation film with pulse infrared light having a wavelength that is within a wavelength region depending upon the insulation film and that is absorbed by the insulation film.

DETAILED DESCRIPTION OF THE INVENTION

Hereafter, embodiments of the present invention will be described in detail with reference to the drawings. By the way, the drawings are schematic. Relations in respective portions between the thickness and the width, and ratios in size between portions differ from actual ones. Furthermore, even if the same portions are shown in drawings, they might be shown with different dimensions and ratios.

First Embodiment

Figure 1:
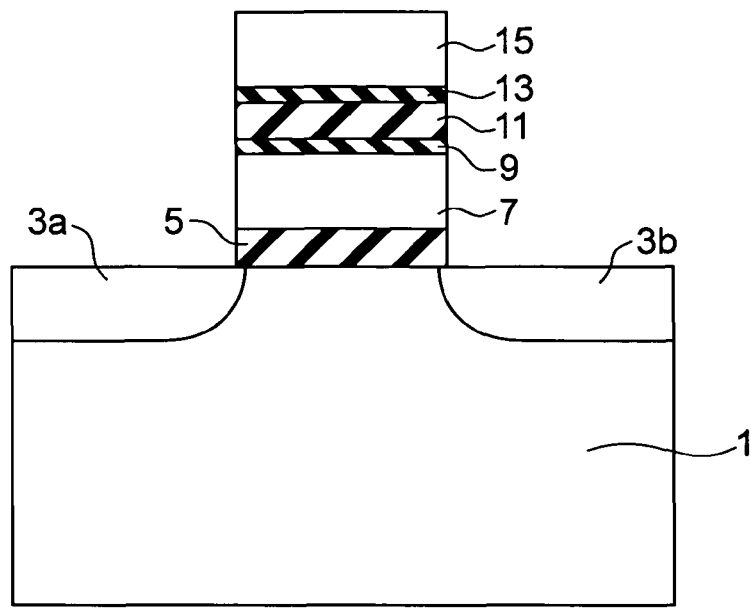
FIG. 1 is a sectional view of a semiconductor device manufactured by using a manufacturing method according to a first embodiment of the present invention.

A manufacturing method of a semiconductor device according to a first embodiment of the present invention will now be described. A semiconductor device manufactured by using the manufacturing method according to the present embodiment is shown in FIG. 1. This semiconductor device is a flash memory. FIG. 1 shows a sectional view of its memory cell. In this memory cell, a source region 3a and a drain region 3b kept apart are formed on a silicon substrate 1. A tunnel oxide film 5 is formed on the silicon substrate 1 between the source region 3a and the drain region 3b. A floating electrode 7 is formed of polycrystalline silicon with phosphorus added on the tunnel oxide film 5. A lower silicon nitride film 9 is formed on the floating electrode 7. A high-k insulation film 11 is formed of HfSiO on the lower silicon nitride film 9. An upper silicon nitride film 13 is formed on the high-k insulation film 11. A control electrode 15 is formed of polycrystalline silicon with phosphorus added on the upper silicon nitride film 13.

This memory cell is formed as described below. First, the tunnel oxide film 5 is formed by conducting thermal oxidation on the silicon substrate 1. Subsequently, the polycrystalline silicon film 7 with phosphorus added is formed on the tunnel oxide film 5 by using the LPCVD (Low Pressure Chemical Vapor Deposition).

Subsequently, the polycrystalline silicon film 7 heated to and retained at approximately 600° C. by exposure to halogen lamp light is subjected to exposure to infrared laser light having a wavelength of 3 μm and a pulse width of 50 fs (femto-seconds) while it is exposed to ammonia gas. The lower silicon nitride film 9 having a thickness of 1 nm is thus formed. Subsequently, the HfSiO film 11 having a thickness of 30 nm is formed on the lower silicon nitride film 9 by using the MOCVD (Metal Organic Chemical Vapor Deposition) at 600° C. Thereafter, heat treatment is conducted in the RTA equipment using a halogen lamp at 1000° C. for 30 seconds in order to improve the film quality.

Subsequently, when depositing the upper silicon nitride film 13 having a thickness of approximately 1 nm by using the ALD of silicon chloride gas and ammonia gas, it is subjected to exposure to infrared laser light having a wavelength of 3 μm and a pulse width of 50 fs. After the upper silicon nitride film 13 is formed, the RTA processing is not conducted.

Subsequently, the polycrystalline silicon film 15 with phosphorus added is deposited as the control electrode, and then heat treatment is conducted at 1000° C. for 30 seconds for activation. Subsequently, a resist pattern which is not illustrated is formed on the polycrystalline silicon film 15 with phosphorous added. The polycrystalline silicon film 15 with phosphorous added, the upper silicon nitride film 13, the HfSiO film 11, the lower silicon nitride film 9, the polycrystalline silicon film 7 with phosphorous added, and the tunnel oxide film 5 are patterned by using the resist pattern as a mask to form a gate part. Thereafter, ion implantation of impurities is conducted in the silicon substrate 1 by using the gate part as a mask. As a result, the source region 3a and the drain region 3b are formed to complete the memory cell.

In the memory cell thus formed, it is possible to sufficiently suppress the reaction between the high-k insulation film 11 formed of HfSiO and the control electrode 15 during heat treatment after formation of the control electrode 15, by forming the upper silicon nitride film 13 having a thickness of 1 nm.

Figure 2:
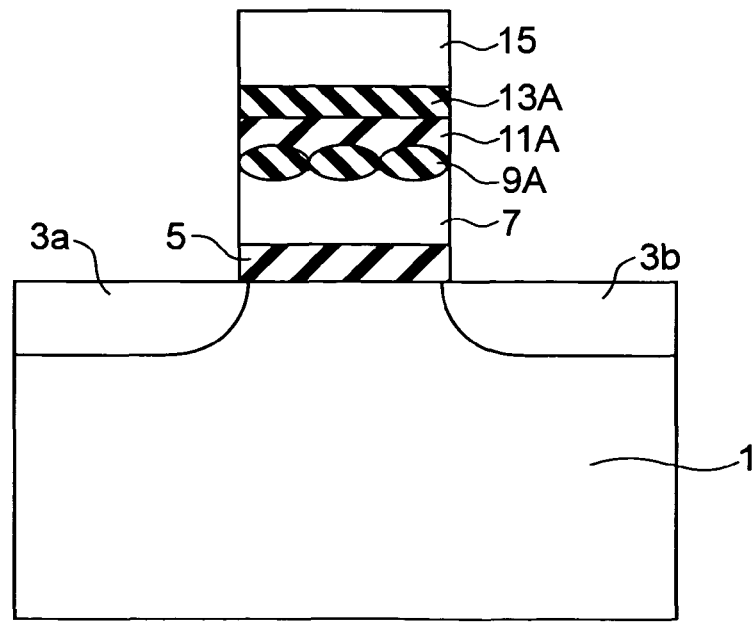
FIG. 2 is a sectional view of a semiconductor device manufactured by using a manufacturing method according to a comparison example of the first embodiment.

Subsequently, as a comparison example, a memory cell of a flash memory cell shown in FIG. 2 is formed. The memory cell of the comparison example has a configuration obtained by replacing the lower silicon nitride film 9, the high-k insulation film 11 formed of HfSiO, and the upper silicon nitride film 13 in the memory cell of the present embodiment shown in FIG. 1 with a lower silicon nitride film 9A, a high-k insulation film 11A formed of HfSiO, and an upper silicon nitride film 13A, respectively. A manufacturing method of the memory cell in the comparison example differs from that in the present embodiment only in the manufacturing method of the lower silicon nitride film and the upper silicon nitride film. Formation of other films is conducted in the same way as that in the present embodiment.

The manufacturing method of the lower silicon nitride film 9A and the upper silicon nitride film 13A in the memory cell according to the comparison example will now be described.

The lower silicon nitride film 9A having a thickness of 1 nm is formed by supplying ammonia gas while heating the polycrystalline silicon film 7 in RTA equipment using a halogen lamp and causing reaction between the polycrystalline silicon film 7 and ammonia gas. By the way, in this case, the polycrystalline silicon film 7 is heated to 1000° C. in order to sufficiently reduce impurities (NHx) contained in the silicon nitride film.

Subsequently, the HfSiO film 11A having a thickness of 30 nm is formed on the lower silicon nitride film 9A by using MOCVD at 600° C. Then quality improving processing is conducted in the RTA equipment at 1000° C. for 30 seconds. Thereafter, the upper silicon nitride film 11A is formed by using the ALD with silicon chloride gas and ammonia gas. Then, heating to 1000° C. is conducted in the RTA equipment in order to remove impurities such as chlorine and hydrogen contained in the film.

Subsequently, the polycrystalline silicon film with phosphorus added is formed as the control electrode 15. Thereafter, heat treatment for activation is conducted at 1000° C. for 30 seconds. For sufficiently suppressing the reaction between the HfSiO film 11A and the control electrode 15 in this heat treatment, it is necessary to set the thickness of the silicon nitride film 13A to 2 nm or more.

Subsequently, leak current characteristics of high-k insulation films formed of HfSiO and manufactured by using the manufacturing methods according to the present embodiment and comparison example are evaluated. As a result, the HfSiO film 11 interposed between the silicon nitride films 9 and 13 formed by using the manufacturing method according to the present embodiment is smaller by two digits in leak current than the HfSiO film 11A interposed between the silicon nitride films 9A and 13A formed by using the manufacturing method according to the comparison example. The XPS analysis is conducted on the silicon nitride films 9 and 9A and the HfSiO films 11 and 11A in order to make the cause clear. As a result, N—H bond is detected from the silicon nitride film 9A formed by using the method according to the comparison example, and Si suboxide is detected from the HfSiO film 11A. However, they are lower than detection limits in the silicon nitride film 9 and the HfSiO film 11 formed by using the method according to the present embodiment.

In addition, the film structures are evaluated by using a sectional TEM (Transmission Electron Microscope). As a result, the thickness of the lower silicon nitride film 9 formed by using the method according to the present embodiment is nearly even at the atomic level, whereas the thickness of the lower silicon nitride film 9A formed by using the method according to the comparison example is uneven. The Si suboxide detected in the HfSiO film 11A is presumed to be generated from silicon diffused from the underlying silicon film into the HfSiO film 11A through thin places in the silicon nitride film 9A.

Figure 3:
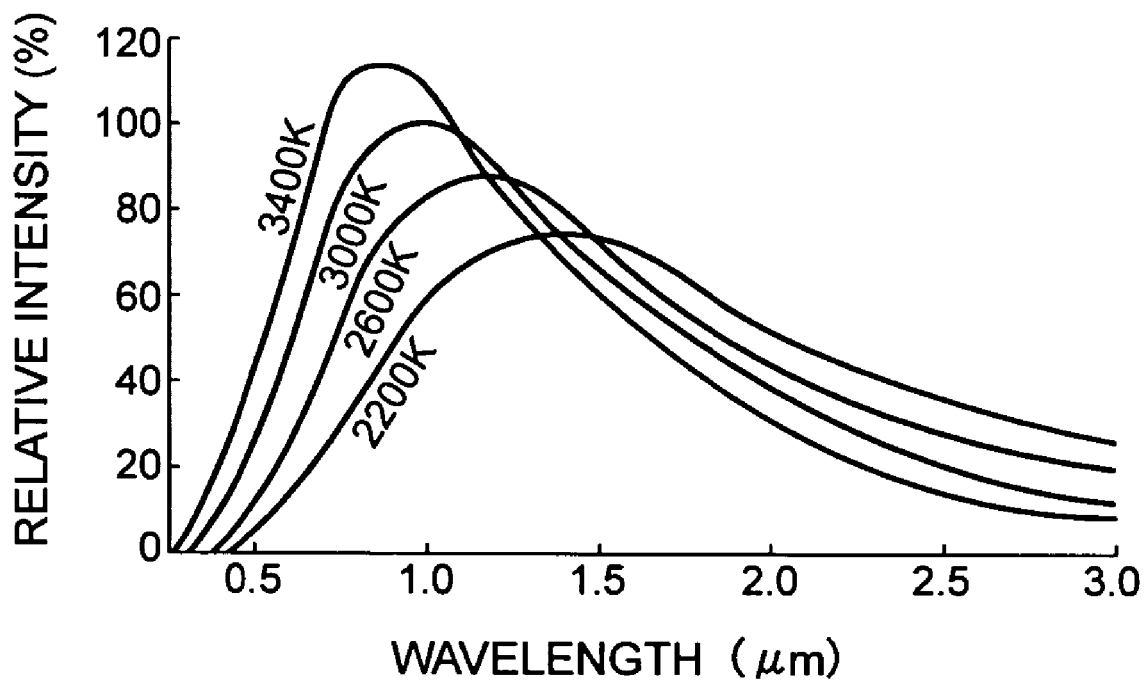
FIG. 3 is a diagram showing wavelength distribution of relative light intensity of a halogen lamp.

The difference in the thickness evenness of the silicon nitride film according to the film forming method will now be described. FIG. 3 is a diagram showing an example of light emission intensity characteristics of the halogen lamp widely used in the RTA equipment. It is appreciated that the halogen lamp has a peak near the wavelength of 1 μm, and has some intensity in a wide wavelength region ranging from 0.1 μm to 3 μm.

Figure 4:
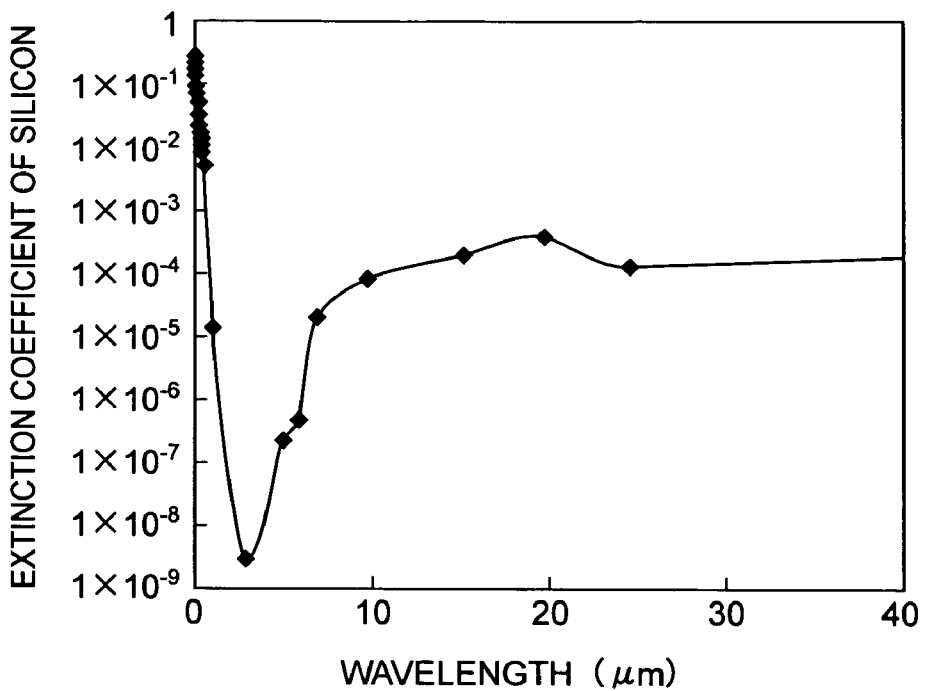
FIG. 4 is a diagram showing dependence of the extinction coefficient of silicon upon the wavelength.

On the other hand, FIG. 4 shows dependence of the extinction coefficient of silicon upon the wavelength. By the way, the extinction coefficient indicates a value that represents easiness of optical absorption, and it has a relation of proportionality to an optical absorption coefficient ($k=c\alpha/(2\omega)$), where k: extinction coefficient, c: velocity of light, $\alpha$: optical absorption coefficient, and $\omega$: angular velocity of light). It is appreciated from FIG. 4 that the optical absorption of silicon becomes small as the wavelength becomes larger than 1.1 μm that corresponds to the band gap of silicon. However, it is also appreciated that optical absorption increases on a longer wavelength side than approximately 3 μm and optical absorption becomes nearly constant at wavelengths longer than approximately 9 μm. By the way, the optical absorption on the wavelength side longer than approximately 3 μm is caused by excitation of free electrons of silicon. It is appreciated from FIGS. 3 and 4 that the polycrystalline silicon film 7 absorbs irradiation light of the halogen lamp and the polycrystalline silicon film 7 is heated.

If the polycrystalline silicon film 7 heated by irradiation of halogen lamp light is exposed to ammonia gas, nitridation reaction of silicon is caused by ammonia decomposed at the surface of silicon and a silicon nitride film is formed. At the time of this nitridation reaction, local stress is caused in both the silicon nitride film and the underlying silicon due to bond change from Si—Si to Si—N. In situations where the polycrystalline silicon film 7 is heated to a temperature as high as approximately 1000° C. and silicon atoms included in the film can move with comparative ease as in the method according to the comparison example, movement of silicon atoms occurs at the interface between the silicon nitride film and the silicon film so as to mitigate the stress. In the method according to the comparison example, therefore, aggregation in the silicon nitride film advances and island-shaped silicon nitride film is formed.

On the other hand, in the method according to the present embodiment, the temperature of the polycrystalline silicon film 7 is as low as approximately 600° C. As a result, movement of silicon atoms occurs scarcely and the silicon nitride film 9 having an even thickness is formed. In general, however, a lot of impurities (NHx) remain in the silicon nitride film formed at temperatures as low as approximately 600° C. In the present embodiment, however, the surface of the polycrystalline silicon film 7 is subjected to exposure to laser light having a center wavelength of 3 μm and a pulse width of 50 fs simultaneously with exposure to ammonia gas. As the silicon nitride film has optical absorption in the region of wavelength of 3 μm or more (especially in the wavelength region ranging from approximately 9 μm to 14 μm), light having this wavelength is not absorbed so much not only by the polycrystalline silicon film 7, but also by the silicon nitride film 9. On the other hand, impurities NHx contained in the silicon nitride film 9 absorbs light having this wavelength and its temperature rises. Since the time period of exposure to light is as short as 50 fs, heat conduction from heated NHx in the silicon nitride film 9 to the underlying silicon film 7 occurs scarcely during light irradiation. If the method according to the present embodiment is used, it is thus possible to heat selectively and remove NHx contained in the silicon nitride film 9 without raising the temperature of the underlying polycrystalline silicon film 7 excessively, and hence suppressing the aggregation of the silicon nitride film. Therefore, it is considered that a silicon nitride film containing few impurities (NHx) and having an even thickness is formed.

By the way, the silicon nitride film 9 formed in the present embodiment is heated by heat conduction from NHx excited by exposure to laser light. Though it might be only for a short time, therefore, the temperature in the silicon nitride film 9 could rise to the vicinity of 1200° C. that is the expected viscosity increase temperature (two thirds of the melting point (approximately 1900° C.) of the silicon nitride. It is considered that this also contributes to the improved evenness of the thickness of the silicon nitride film.

This temperature rise may also increase the film density, and resultantly, barrier property of the silicon nitride film. Therefore, it is considered that the upper silicon nitride film 13 formed by using the method according to the present embodiment can suppress the reaction between the high-k insulation film 11 and the control electrode 15 although it is thinner than the silicon nitride film 13A formed by using the method according to the comparison example.

According to the present embodiment, a silicon nitride film having a high quality can be formed as heretofore described.

In the present embodiment, the manufacturing method of the high-k insulation film formed between the floating electrode and the control electrode of a flash memory cell and the silicon nitride formed with the object of suppressing the reaction with these electrodes has been described. However, the manufacturing method can also be applied to the case where the silicon nitride film is formed as a reaction suppression layer between a high-k gate insulation film and an upper electrode of a MOS transistor or a base film of a silicon nitride film/silicon oxide film stacked gate insulation film. This is because the silicon nitride film formed by using the method according to the present method has even thickness, high density, and high reaction suppression capability and oxidation resistance.

It is known that a silicon nitride film formed directly on a silicon substrate by using a conventional method such as thermal nitridation of silicon with ammonia gas exhibits a high interface state. On the other hand, a silicon nitride film formed directly on a silicon substrate by using the method according to the present embodiment has a comparatively low interface state. This is presumed to be caused by the fact that the silicon nitride film formed by using the method according to the present embodiment is heated to a higher temperature than that of the film formed according to the conventional art and has less film stress and consequently distortion is not applied so much to the interface to the silicon substrate. Therefore, the silicon nitride film formed by using the method according to the present embodiment can be used as an interface reaction suppression layer between the high-k gate insulation film and the substrate or the gate insulation film.

The present embodiment has been described as to an application example of the silicon nitride film. However, the present embodiment can also be applied to an aluminum oxide film or a high-k insulation film of transition metal formed by using the CVD or ALD. In general, impurities such as NHx, CHx and OH remain in the film formed by using the CVD or ALD. It is possible to remove these impurities and improve the barrier property and electrical characteristics of the film by applying the present invention.

Second Embodiment

Figure 5:
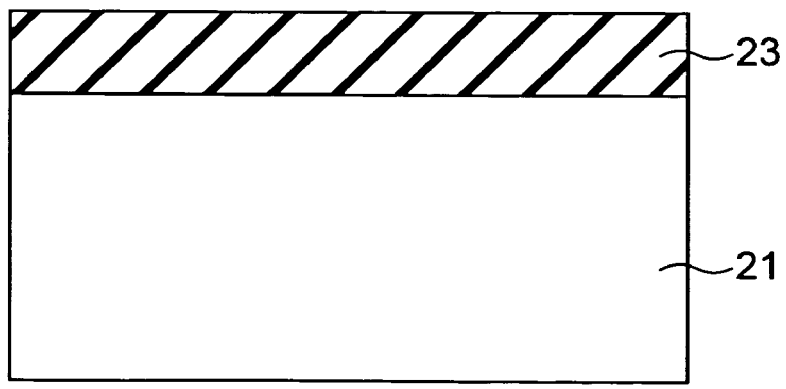
FIG. 5 is a sectional view of a semiconductor device manufactured by using a manufacturing method according to a second embodiment of the present invention.

A manufacturing method of a semiconductor device according to a second embodiment of the present invention will now be described. FIG. 5 is a sectional view of a semiconductor device manufactured by using a manufacturing method according to the present embodiment. In this semiconductor device, a high-k gate insulation film 23 is formed on a silicon substrate 21. This semiconductor device is manufactured as hereafter described.

First, the silicon substrate 21 is subjected to wet cleaning, and contamination and a natural oxide film on the surface are removed. Thereafter, an HfSiO film having a thickness of approximately 5 nm is formed at approximately 600° C. by using the MOCVD method. In addition, the HfSiO film is subjected to exposure to infrared laser light having a wavelength of 8.5 μm and a pulse width of 10 fs in an atmosphere of oxygen under the atmospheric pressure in order to remove impurities and defects contained in the film. The high-k gate insulation film 23 is thus formed.

As a first comparison example, formation is conducted in the same way as the present embodiment until an HfSiO film is formed on the silicon substrate 21. Thereafter, the HfSiO film is subjected to exposure to infrared lamp light that is continuous light and has a wavelength region of 5 μm to 15 μm, in an atmosphere of oxygen under the atmospheric pressure in order to remove impurities and defects contained in the film. A gate insulation film 23A is thus formed (see FIG. 6).

Figure 7:
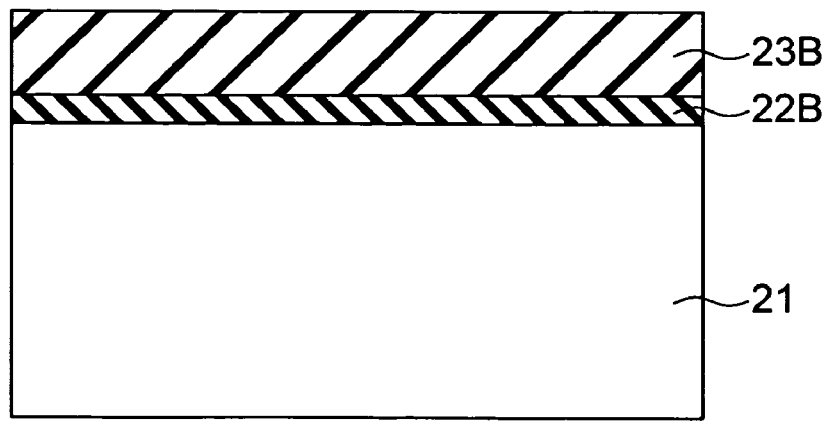
FIG. 7 is a sectional view of a semiconductor device manufactured by using a manufacturing method according to a second comparison example of the second embodiment.

As a second comparison example, formation is conducted in the same way as the present embodiment until an HfSiO film is formed on the silicon substrate 21. Thereafter, the HfSiO film is subjected to exposure to $CO_2$ laser light having a wavelength of 10.6 μm and a pulse width of 50 ns, in an atmosphere of oxygen under the atmospheric pressure in order to remove impurities and defects contained in the film. A gate insulation film 23B is thus formed (see FIG. 7).

Figure 8:
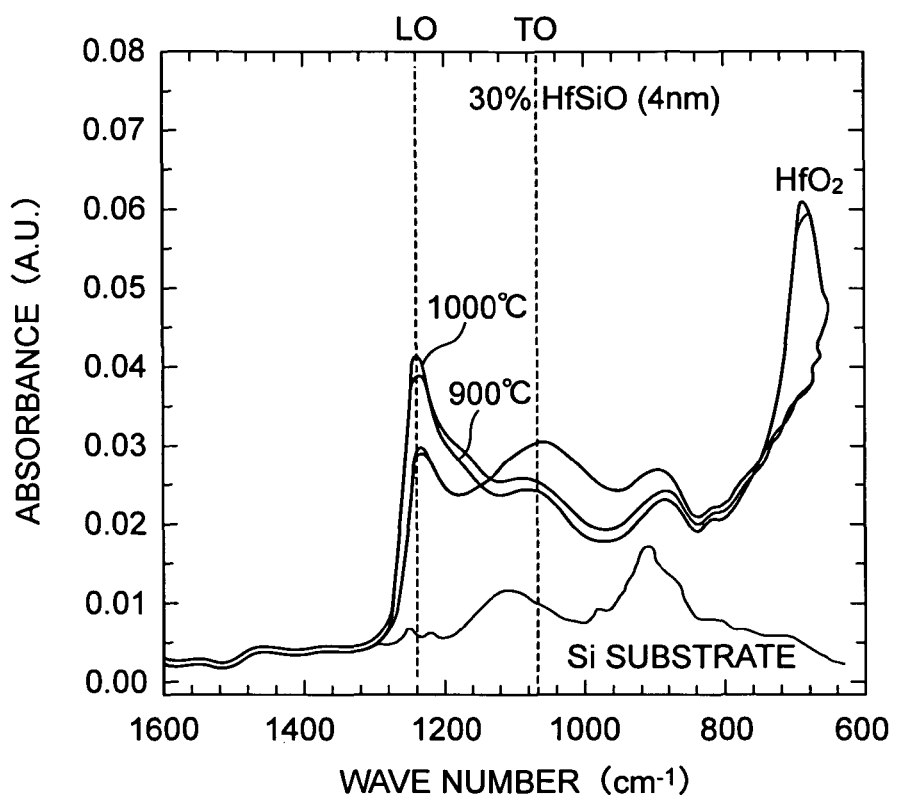
FIG. 8 is a diagram showing dependence of optical absorption of an HfSiO film formed on a silicon substrate upon the wavelength.

FIG. 8 shows an FTIR spectrum of a sample obtained by an HFSiO film deposited on a Si substrate (Applied Physics Letters Vol. 87 (2005) p. 012902-1). As appreciated from FIG. 8, the HfSiO film absorbs infrared light having a wave number in the range of approximately 1200 $cm^{-1}$ to 800 $cm^{-1}$ (approximately 8 μm to 12 μm) corresponding to lattice vibration in Hf—O—Si. Unlike the RTA equipment using halogen lamp light, therefore, the HfSiO film can be heated if it is subjected to exposure to any of the above-described infrared lamp light, $CO_2$ laser light, and infrared laser light.

However, impurities (such as carbon and hydrogen) contained in the film after exposure processing decrease in the order of the first comparison example, the second comparison example, and the present embodiment. The leak current and the trap characteristics in the film degrade in the order of the present embodiment, the second comparison example, and the first comparison example.

Figure 6:
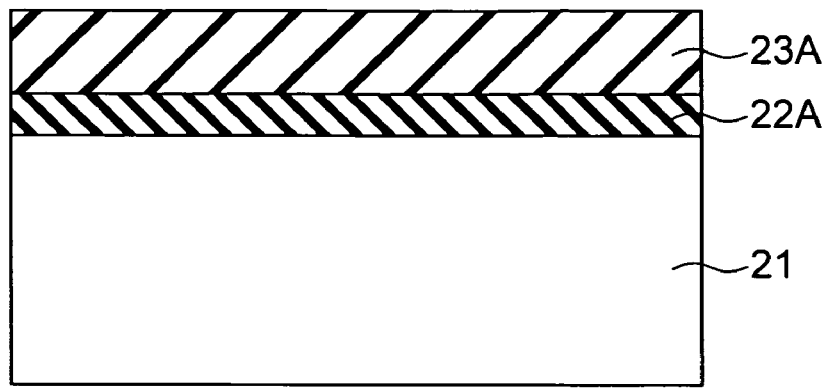
FIG. 6 is a sectional view of a semiconductor device manufactured by using a manufacturing method according to a first comparison example of the second embodiment.

In the semiconductor device manufactured by using the manufacturing method according to the first comparison example, a silicon oxide film 22A having a thickness of approximately 3 nm is formed at an interface between the gate insulation film 23A formed of HfSiO after the exposure processing and the silicon substrate 21 (see FIG. 6). In the semiconductor device manufactured by using the manufacturing method according to the second comparison example, a silicon oxide film 22B having a thickness of approximately 1 nm is formed at an interface between the gate insulation film 23B formed of HfSiO and the silicon substrate 21 (see FIG. 7).

On the other hand, in the semiconductor device manufactured by using the manufacturing method according to the present embodiment, the silicon oxide film is hardly formed between the gate insulation film 23 formed of HfSiO and the silicon substrate 21 (see FIG. 5).

The reason why the HfSiO films differ in impurities, electrical characteristics and thickness of the oxide film at the interface is that how the HfSiO film and the silicon substrate are heated differs according to the wavelength and pulse width of infrared light. Hereafter, this mechanism will be described.

Figure 9:
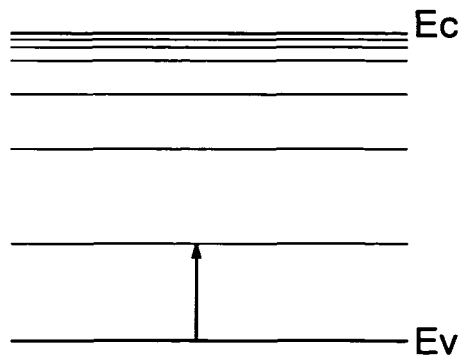
FIG. 9 is a diagram showing an electron excitation process of an insulation film subjected to exposure to infrared light having a low intensity.
Figure 10A:
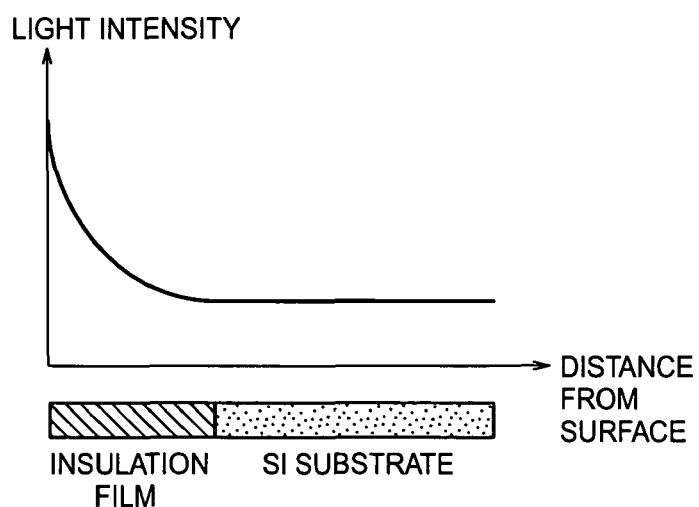
FIGS. 10A to 10C are diagrams showing the light intensity and temperature distribution obtained when exposure of a sample having an insulation film/silicon structure to infrared lamp light having a low intensity is conducted.
Figure 10B:
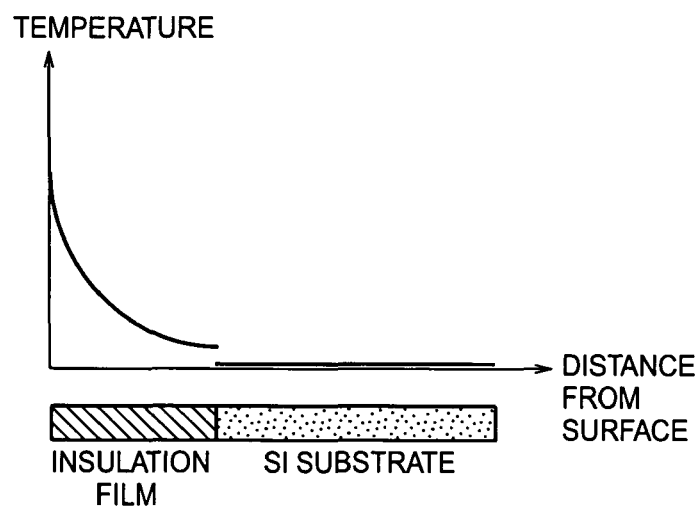
Figure 10C:
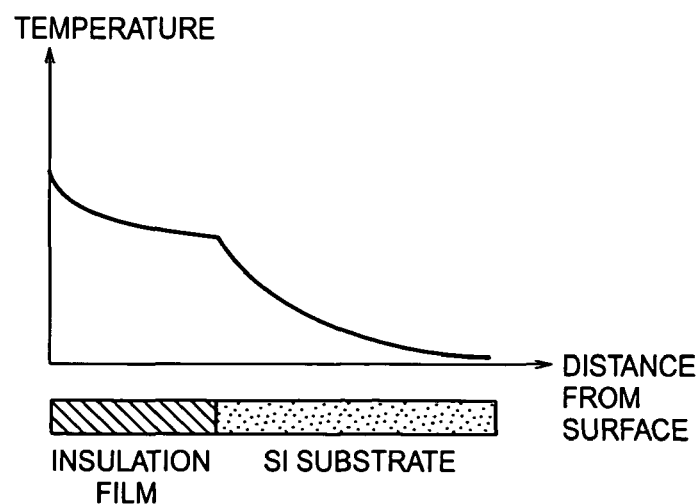

FIG. 9 shows a process of optical absorption in the case where the insulation film is subjected to exposure to infrared light. Here, Ev denotes a valence band of the insulation film, and EC denotes an energy level of the conduction band. A vibrational level is present between the valence band and the conduction band. If the insulation film is subjected to exposure to infrared light having energy greater than an energy difference between the lowest vibrational level and the valence band, then electrons are excited from the valence band to the vibrational level and infrared light is absorbed by the insulation film (see FIG. 9). If the insulation film is subjected to exposure to light having a comparatively low intensity such as infrared lamp light, electrons excited to the vibrational level are rarely excited to a further high energy level. That is multiphoton absorption occurs scarcely. In other words, only single-photon absorption occurs in the insulation film, and the light intensity decreases exponentially in the film depth direction. If the sample having the stacked structure of the insulation film and silicon is subjected to exposure to infrared lamp light having a wavelength at which optical absorption of silicon is little and that of the insulation film is large, the light intensity in the sample during light irradiation becomes as shown in FIG. 10A. Since the great part of light absorbed by the insulation film is converted to heat and light absorbed by silicon is little, temperature distribution in the sample immediately after exposure to light becomes as shown in FIG. 10B. After some time elapses from the start of exposure to light, the temperature distribution becomes comparatively gentle, as shown in FIG. 10C. This is because heat conduction occurs from a high temperature portion to a low temperature portion in the insulation film and from the insulation film to the silicon substrate.

Unlike the case where the halogen lamp light is used, it is possible to heat the insulation film to a temperature higher than that for the silicon substrate by exposure to infrared lamp light. However, the temperature difference between the insulation film and the silicon substrate cannot be made so large. In the quality improving processing conducted by exposure to infrared lamp light, therefore, impurities in the HfSiO film 23A cannot be removed sufficiently. In addition, a thick silicon oxide film 22A is apt to be formed at the interface between the insulation film and the silicon substrate at the time of processing.

Figure 11:
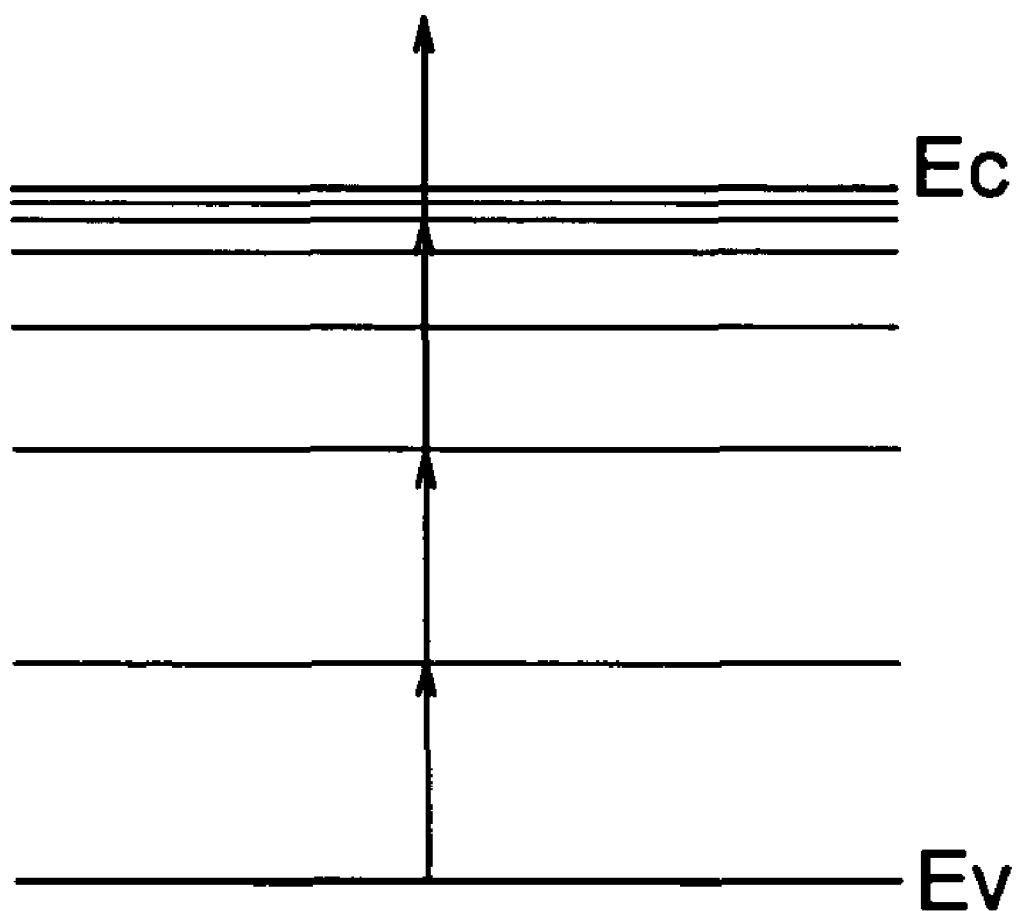
FIG. 11 is a diagram showing an electron excitation process of an insulation film subjected to exposure to infrared light having a high intensity.
Figure 12A:
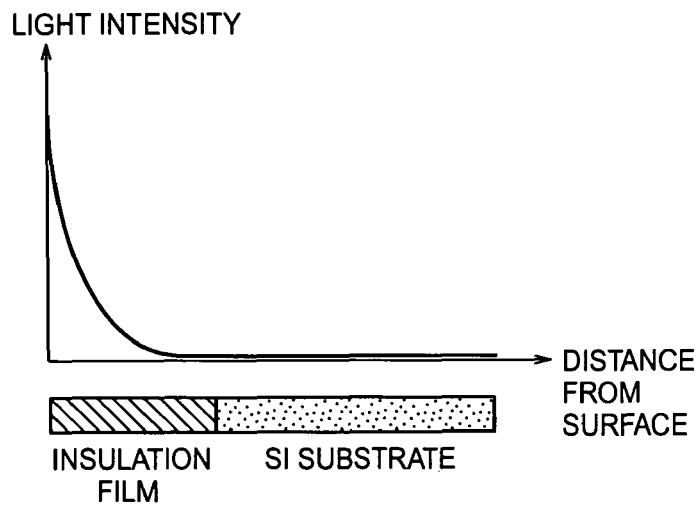
FIGS. 12A to 12C are diagrams showing the light intensity and temperature distribution obtained when a sample having an insulation film/silicon structure is subjected to exposure to infrared pulse laser light having a high intensity.

On the other hand, if the insulation film is subjected to exposure to infrared light having a high intensity such as infrared pulse laser light, electrons excited to the vibrational level absorb infrared light again, and the electrons are excited to a higher vibrational level, and to the conduction band (see FIG. 11). In this case, electrons in the conduction band absorb infrared light with a higher efficiency than electrons in the conduction band or at the vibrational level. If excitation of electrons to the conduction band is caused on the surface of the insulation film by exposure to infrared light, therefore, the optical absorption efficiency in that portion increases. If the insulation film is subjected to exposure to infrared light having high intensity, therefore, the light intensity in the insulation film abruptly decreases as the distance from the surface becomes large (see FIG. 12A).

Figure 12B:
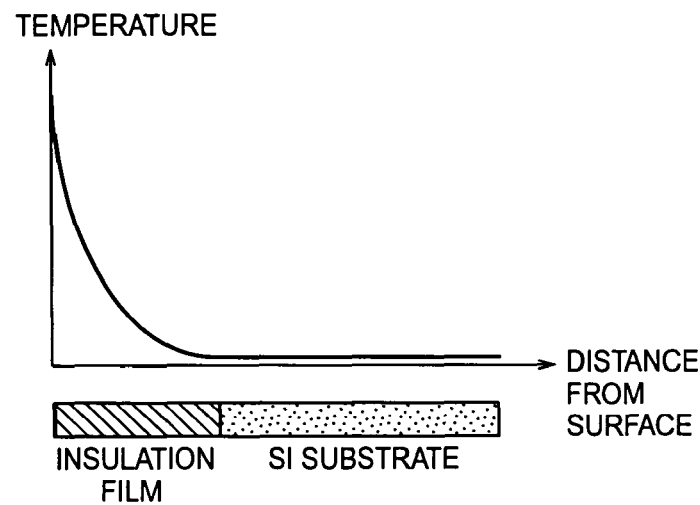

If the insulation film is subjected to exposure to pulsative infrared light having high intensity and a pulse width of 1 picosecond or less, then the insulation film which is being subjected to exposure to light is in the non-equilibrium state and the temperature cannot be defined. If approximately one picosecond elapses from the start of exposure to light, then electrons in the conduction band generated by infrared light absorption recombine with holes and a part of energy generated in this process excites the lattice vibration of the film. As a result, the insulation film is heated to a high temperature. When approximately one picosecond has elapsed after exposure to femto-second infrared laser light, it is presumed that the sample including the stacked structure of the insulation film and the silicon substrate exhibits temperature distribution in which the temperature on the surface of the insulation film is very high and the temperature abruptly falls as the distance from the surface increases (see FIG. 12B).

As compared with the femto-second laser light (wavelength 3 μm) used in the first embodiment, femto-second laser light (wavelength 8.5 μm) to which exposure of the sample is conducted in the present embodiment is not very small in optical absorption coefficient of silicon (FIG. 4). Whereas laser light is absorbed only by a very small amount of impurities contained in the insulation film in the first embodiment, however, the insulation film itself absorbs laser light in the present embodiment. In the present embodiment as well, therefore, the HfSiO film can be heated to a high temperature (approximately the viscosity increase temperature) without raising the temperature of silicon in the vicinity of the interface so much. It is considered that as a result the concentration of impurities in the HfSiO film can be decreased sufficiently and the electrical characteristics can be improved remarkably without almost forming a silicon oxide film at the interface between the insulation film and the silicon substrate.

By the way, the film quality of the HfSiO film can be improved by exposure to $CO_2$ laser light having a pulse width of 50 ns as in the second comparison example. However, its degree of quality change cannot match the processing of exposure to femto-second laser light in the present embodiment.

If processing of exposure to $CO_2$ laser light is conducted, a silicon oxide film having some thickness is formed at the interface between the insulation film and silicon, although it is thinner than a thickness obtained by processing of exposure to infrared lamp light in the first comparison example. It is considered that this is because the processing of exposure to $CO_2$ laser light is lower in heating selectivity of the surface as compared with the inside of the insulation film than the processing of exposure to infrared laser light having a pulse width in the order of femto-second. In most $CO_2$ pulse-laser, in which pulse width of light is in the order of nano-second, light intensity is lower than that of femto-second laser light. Therefore, when the insulator film is irradiated by $CO_2$ pulse-laser light, electrons in the film are scarcely excited to the conduction band through multiphoton absorption.

Figure 12C:
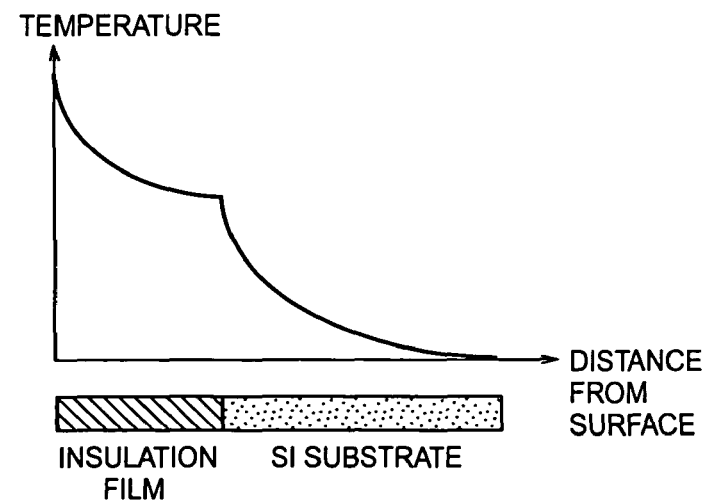

When the stack-structure sample composed of insulation film and silicon substrate is exposed to $CO_2$ pulse-laser light whose pulse width is in the order of nano-second, heat conduction occurs during light exposure and the temperature within the insulation film rises. As temperature increase means electron excitation to a higher vibrational level, electrons at portion heated at high temperature can be excited to the conduction band by light irradiation even if light intensity is not so large. When the insulation film is subjected to exposure to $CO_2$ nano-second pulse laser light having high intensity such as to cause excitation of electrons to the conduction band, therefore, excitation of electrons to the conduction band occurs and the temperature rises not only on the surface of the film but also within the insulation film (see FIG. 12C). Unlike the case of the present embodiment where the insulation film is subjected to exposure to laser light having a pulse width in the order of femto-second, therefore, steep temperature distribution cannot be implemented.

Pulsative infrared laser having a wavelength of 3 μm is used in the first embodiment, and pulsative infrared laser having a wavelength of 8.5 μm is used in the second embodiment. The wavelengths of infrared light used in the exposure are not restricted to these wavelengths 3 μm and 8.5 μm. Optical absorption of silicon at wavelengths longer than 1.1 μm is comparatively low. On the other hand, an insulation film having silicon-nitrogen bonds absorbs (far) infrared light in a wavelength region of approximately 14 μm or less (especially in the range of 9 μm or more to 14 μm or less). An insulation film having aluminum-oxygen bonds absorbs (far) infrared light in a wavelength region of approximately 20 μm or less (especially in the range of 9 μm or more to 20 μm or less). An insulation film having transition metal-oxygen-silicon bonds or transition metal-oxygen-aluminum bonds absorbs (far) infrared light in a wavelength region of approximately 12 μm or less (especially in the range of 8 μm or more to 12 μm or less). An insulation film having transition metal-oxygen bonds absorbs (far) infrared light in a wavelength region of approximately 40 μm or less (especially in the range of 12 μm or more to 40 μm or less).

Figure 13:
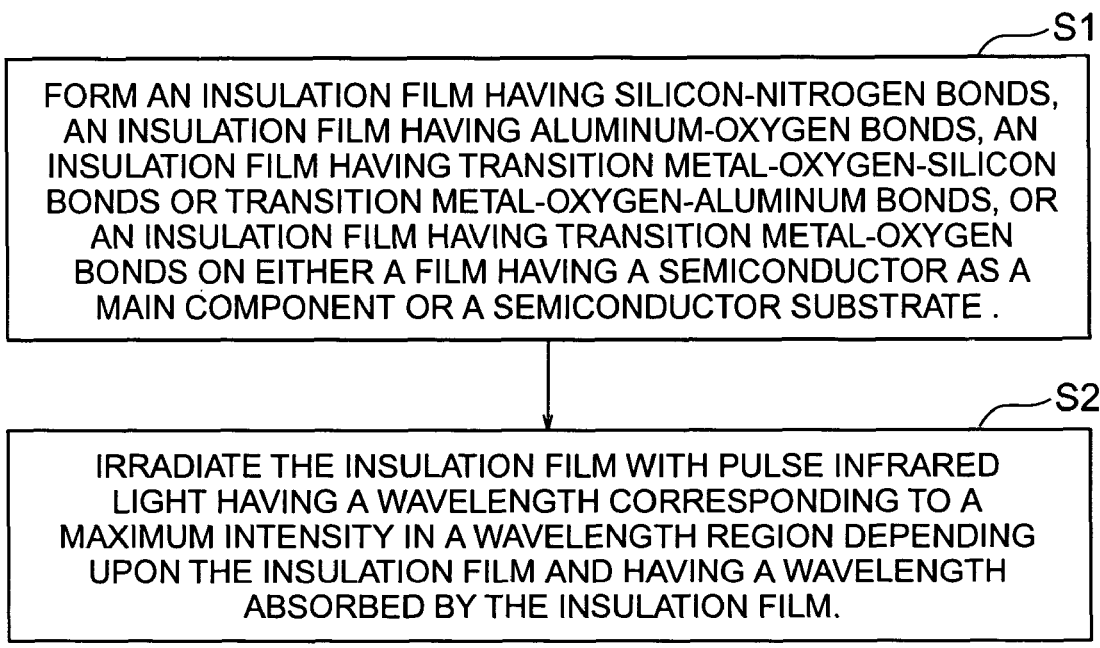
FIG. 13 is a flow chart showing a manufacturing process of a manufacturing method of a semiconductor device according to an embodiment of the present invention.

As shown in FIG. 13, therefore, an insulation film having silicon-nitrogen bonds, an insulation film having aluminum-oxygen bonds, an insulation film having transition metal-oxygen-silicon bonds or transition metal-oxygen-aluminum bonds, or an insulation film having transition metal-oxygen bonds is formed on either a film having a semiconductor as a main constituent element or a semiconductor substrate (step S1). Thereafter, the insulation film is subjected to exposure to pulsative infrared light having a wavelength corresponding to a maximum intensity in a wavelength region depending upon the insulation film (in the range of 1.1 μm or more to 14 μm or less (more preferably in the range of 9 μm or more to 14 μm or less) for an insulation film having silicon-nitrogen bonds, in the range of 1.1 μm or more to 20 μm or less (more preferably in the range of 9 μm or more to 20 μm or less) for an insulation film having aluminum-oxygen bonds, in the range of 1.1 μm or more to 12 μm or less (more preferably in the range of 8 μm or more to 12 μm or less) for an insulation film having transition metal-oxygen-silicon bonds or transition metal-oxygen-aluminum bonds, and in the range of 1.1 μm or more to 40 μm or less (more preferably in the range of 12 μm or more to 40 μm or less) for an insulation film having transition metal-oxygen bonds) and having a wavelength absorbed by the insulation film (step S2). As a result, the insulation film on the surface can be selectively heated while suppressing the temperature rise in the semiconductor film and the semiconductor substrate.

The silicon-nitrogen bonds, aluminum-oxygen bonds, transition metal-oxygen-silicon bonds, transition metal-oxygen-aluminum bonds, or transition metal-oxygen bonds in the insulation film can be measured by using, for example, the XPS (X-ray Photoelectron Spectroscopy).

By the way, the insulation film having silicon-nitrogen bonds is, for example, either a silicon nitride film or a silicon oxide nitride film. The insulation film having aluminum-oxygen bonds is, for example, either an aluminum oxide film or an aluminum oxide nitride film. The insulation film having transition metal-oxygen-silicon bonds is, for example, a silicate film or a silicate nitride film containing at least one metal element from among Hf, Zr, Y, La, Ce and Ta. The insulation film having transition metal-oxygen-aluminum bonds is, for example, an aluminate film or an aluminate nitride film containing at least one metal element from among Hf, Zr, Y, La, Ce and Ta. The insulation film having transition metal-oxygen bonds is, for example, an oxide film or an oxide nitride film containing at least one metal element from among Hf, Zr, Y, La, Ce and Ta.

Infrared laser having a pulse width of 50 femto-seconds is used in the first embodiment, and infrared laser having a pulse width of 10 femto-seconds is used in the second embodiment. If the pulse width of the irradiation infrared light is 1 nano-second or less, however, then heat conduction from the surface to the inside of the film is not caused so much during exposure to light and it is possible to implement surface heating of the insulation film.

In the description of the embodiment, the HfSiO film is used. However, the present invention can also be applied to other insulation films containing Hf-oxygen bonds, such as an $HfO_2$ film, an HfON film and an HfAlO film, a metal oxide film, a metal oxide nitride film, a metal silicate film, a metal aluminate film (for example, a LaAlO film) or an aluminum oxide film containing a bond between a metal element other than Hf, such as Zr, Y, La, Ce or Ta, and oxygen.

In the embodiment, the quality improving processing is conducted by exposure of the insulation film to infrared laser light having a pulse width in the order to femto-second after the insulation film is completely formed. In the case where the insulation film is formed by stacking extremely thin films as in the ALD, the film quality change may also be conducted by conducting exposure every time each layer is formed.

In the embodiment, exposure to infrared light is conducted in the atmosphere of oxygen. Such heating in oxygen is effective to remove impurities and oxygen loss in the film. If heating to a high temperature is conducted under a high oxygen partial pressure, a silicon oxide film having low dielectric constant is apt to be formed at the interface between the insulation film and the silicon substrate. Therefore, it is necessary to control the oxygen partial pressure in the atmosphere precisely at the time of exposure to infrared light, so as not to make it too high. By the way, even if there is no oxygen in the atmosphere, distorted bonds in the film decrease when the insulation film is heated to the viscosity increase temperature or more. If the object is only to remove distorted bonds, therefore, the insulation film may be heated by exposure to pulsative infrared light in an inert atmosphere or a vacuum atmosphere.

The manufacturing method according to the embodiment has been described by taking formation of the transistor formed on the silicon substrate as an example. However, the manufacturing method can also be applied to a transistor on a germanium substrate. Germanium transmits infrared light having a wavelength in the range of 2 μm or more to 12.5 μm or less. Even if infrared light has a wavelength longer than 12.5 μm, the absorption coefficient is smaller by several digits than, for example, that of light having a wavelength less than 2 μm. Therefore, an insulation film is on each of a film having germanium as a main constituent element and a germanium substrate by using either the CVD (Chemical Vapor Deposition) or the ALD (Atomic Layer Deposition). Thereafter, the insulation film is subjected to exposure to pulsative infrared light having a wavelength that is absorbed by impurities contained in the insulation film, i.e., oxygen-hydrogen bonds, nitrogen-hydrogen bonds and carbon-hydrogen bonds and that is in the wavelength range of 2 μm or more to 12.5 μm or less. As a result, it is possible to selectively heat impurities in the high-k insulation film as compared with the germanium film or the germanium substrate, remove these impurities, and improve the quality of the insulation film.

Furthermore, an insulation film having silicon-nitrogen bonds, aluminum-oxygen bonds, transition metal-oxygen-silicon bonds, transition metal-oxygen-aluminum bonds, silicon-nitrogen bonds, or transition metal-oxygen bonds is deposited on each of a film having germanium as a main constituent element and a germanium substrate. Thereafter, the insulation film is subjected to exposure to pulsative infrared light having a wavelength that is present in the wavelength range of 1.1 μm or more to 14 μm or less (more preferably in the wavelength range of 9 μm or more to 14 μm or less) for an insulation film having silicon-nitrogen bonds, in the wavelength range of 1.1 μm or more to 20 μm or less (more preferably in the wavelength range of 9 μm or more to 20 μm or less) for an insulation film having aluminum-oxygen bonds, in the wavelength range of 1.1 μm or more to 12 μm or less (more preferably in the wavelength range of 8 μm or more to 12 μm or less) for an insulation film having transition metal-oxygen-silicon bonds or transition metal-oxygen-aluminum bonds, and in the wavelength range of 1.1 μm or more to 40 μm or less (more preferably in the wavelength range of 12 μm or more to 40 μm or less) for an insulation film having transition metal-oxygen bonds) and having a wavelength absorbed by the insulation film. As a result, it is possible to heat the insulation film to a high temperature and change the quality of the insulation film while suppressing the temperature rise in germanium. By the way, the pulse width of the infrared light used for exposure is preferably 1 nanosecond or less in the same way as the case of silicon.

Impurities in germanium can be activated by heating it to approximately 500° C. If the temperature of germanium becomes higher than 500° C., the evaporation rate of GeO generated from an interface oxide film between the insulation film and germanium increases. In addition, if the temperature of germanium becomes high and approaches approximately 945° C. which is the melting point, diffusion of germanium atoms becomes apt to occur. It these GeO and Ge atoms are taken in, the quality of the insulation film is degraded. Therefore, it is desirable to conduct film quality change processing after forming a high-k insulation film on germanium, while keeping germanium at a temperature as low as, for example, approximately 500° C. It is possible to heat the high-k insulation film to a high temperature at which defects decrease while suppressing the temperature rise of germanium, by applying the present embodiment.

According to the embodiments of the present invention, it is possible to form a silicon nitride film, an aluminum oxide film and a transition metal high-k insulation film of high quality.

In a semiconductor device manufactured by using the manufacturing methods according to the embodiments, a silicon nitride film gate insulation film having a low interface state, an extremely thin silicon nitride film/silicon oxide film stacked gate insulation film having an even film thickness, or a transition metal high-k gate insulation film/inter-electrode insulation film having few defects is formed. Favorable transistor characteristics and charge retaining characteristics can be obtained.

The present invention is not restricted to specific embodiments described above. Those skilled in the art can easily derive further effects and modifications. In other words, various changes can be made on embodiments according to the present invention without departing from the spirits of the invention stipulated in appended claims and their equivalents.

Each of the semiconductor devices manufactured by using the manufacturing methods according to the embodiments of the present invention has a high-k insulation film of high quality, and it is useful in reducing the leak current and improving the reliability of transistors, flash memories and the like.

What is claimed is:

1. A manufacturing method for semiconductor device comprising at least one of a MOS transistor and a memory cell, the at least one of the MOS transistor and the memory cell including an insulation film, the method comprising:

forming the insulation film having at least one kind of bonds selected out of silicon-nitrogen bonds and metal-oxygen bonds, on either a film having silicon as a main component or a silicon substrate, by using either chemical vapor deposition or atomic layer deposition; and irradiating the insulation film with pulse infrared light having a wavelength of a maximum intensity in a range of 1.1 μm or more to 9 μm or less.

2. The method according to claim 1, wherein the insulation film includes at least one kind of bonds selected out of oxygen-hydrogen bonds, nitrogen-hydrogen bonds, and carbon-hydrogen bonds.

3. The method according to claim 1, wherein the insulation film is heated to a temperature higher than 1000° C. by the irradiating.

4. A manufacturing method for semiconductor device comprising at least one of a MOS transistor and a memory cell, the at least one of the MOS transistor and the memory cell including an insulation film, the method comprising:

forming the insulation film having at least one kind of bonds selected out of silicon-nitrogen bonds and metal-oxygen bonds, on either a film having germanium as a main component or a germanium substrate, by using either chemical vapor deposition or atomic layer deposition; and irradiating the insulation film with pulse infrared light having a wavelength of a maximum intensity in a range of 2 μm or more to 12.5 μm or less.

5. The method according to claim 4, wherein the insulation film includes at least one kind of bonds selected out of oxygen-hydrogen bonds, nitrogen-hydrogen bonds, and carbon-hydrogen bonds.

6. The method according to claim 4, wherein the insulation film is heated to a temperature higher than 1000° C. by the irradiating.

7. A manufacturing method for semiconductor device comprising at least one of a MOS transistor and a memory cell, the at least one of the MOS transistor and the memory cell including an insulation film, the method comprising:

forming the insulation film having at least one kind of bonds selected out of silicon-nitrogen bonds, aluminum-oxygen bonds, transition metal-oxygen-silicon bonds, transition metal-oxygen-aluminum bonds, and transition metal-oxygen bonds, on either a film having a semiconductor as a main component or a semiconductor substrate; and irradiating the insulation film with pulse infrared light having a wavelength that is within a wavelength region depending upon the insulation film and that is absorbed by the insulation film.

8. The method according to claim 7, wherein the insulation film has silicon-nitrogen bonds, and the pulsative infrared light has a wavelength of a maximum intensity in a range of 1.1 μm or more to 14 μm or less.

9. The method according to claim 8, wherein the insulation film having the silicon-nitrogen bonds is either a silicon nitride film or a silicon oxynitride film.

10. The method according to claim 7, wherein the insulation film has aluminum-oxygen bonds, and the pulsative infrared light has a wavelength of a maximum intensity in a range of 1.1 μm or more to 20 μm or less.

11. The method according to claim 10, wherein the insulation film having the aluminum-oxygen bonds is either an aluminum oxide film or an aluminum oxide nitride film.

12. The method according to claim 7, wherein the insulation film has transition metal-oxygen-silicon bonds, and the pulsative infrared light has a wavelength of a maximum intensity in a range of 1.1 μm or more to 12 μm or less.

13. The method according to claim 12, wherein the insulation film having the transition metal-oxygen-silicon bonds is a silicate film or a silicate nitride film of at least one metal element selected out of Hf, Zr, Y, La, Ce and Ta.

14. The method according to claim 7, wherein
the insulation film has transition metal-oxygen-aluminum bonds, and
the pulsative infrared light has a wavelength of a maximum intensity in a range of 1.1 μm or more to 12 μm or less.

15. The method according to claim 14, wherein the insulation film having the transition metal-oxygen-aluminum bonds is an aluminate film or an aluminate nitride film of at least one metal element selected out of Hf, Zr, Y, La, Ce and Ta.

16. The method according to claim 7, wherein
the insulation film has transition metal-oxygen bonds, and
the pulsative infrared light has a wavelength of a maximum intensity in a range of 1.1 μm or more to 40 μm or less.

17. The method according to claim 16, wherein the insulation film having the transition metal-oxygen bonds is an oxide film or an oxynitride film of at least one metal element selected out of Hf, Zr, Y, La, Ce and Ta.

18. The method according to claim 7, wherein the film having a semiconductor as a main component and the semiconductor substrate are a film having silicon as a main component and a silicon substrate, or a film having germanium as a main component and a germanium substrate.

19. The method according to claim 7, wherein the insulation film is heated to a temperature higher than 1000° C. by the irradiating.

20. The method according to claim 7, wherein the pulse infrared light has a pulse width of 1 nanosecond or less.

* * * * *